United States Patent
Liu et al.

(10) Patent No.: US 11,066,738 B2
(45) Date of Patent: Jul. 20, 2021

(54) MASK PLATES AND DISPLAY PANELS

(71) Applicant: Kunshan Go-Visionox Opto-Electronics Co., Ltd., Kunshan (CN)

(72) Inventors: Mingxing Liu, Kunshan (CN); Xuliang Wang, Kunshan (CN); Shuaiyan Gan, Kunshan (CN); Feng Gao, Kunshan (CN); Dongyun Lv, Kunshan (CN)

(73) Assignee: KUNSHAN GO-VISIONOX OPTO-ELECTRONICS CO., LTD., Kunshan (CN)

(*) Notice: Subject to any disclaimer, the term of this patent is extended or adjusted under 35 U.S.C. 154(b) by 58 days.

(21) Appl. No.: 16/686,219

(22) Filed: Nov. 18, 2019

(65) Prior Publication Data
US 2020/0080186 A1    Mar. 12, 2020

Related U.S. Application Data

(63) Continuation of application No. PCT/CN2018/105515, filed on Sep. 13, 2018.

(30) Foreign Application Priority Data

Mar. 30, 2018 (CN) .......................... 201810276753.3

(51) Int. Cl.
*B32B 3/00* (2006.01)
*C23C 14/04* (2006.01)

(52) U.S. Cl.
CPC .............. *C23C 14/042* (2013.01); *B32B 3/00* (2013.01); *Y10T 428/24802* (2015.01)

(58) Field of Classification Search
CPC ................................ C23C 14/042; B32B 3/00
See application file for complete search history.

(56) References Cited

U.S. PATENT DOCUMENTS

| | | |
|---|---|---|
| 6,603,159 B2 | 8/2003 | Atobe et al. |
| 6,861,358 B2 | 3/2005 | Hasegawa et al. |

(Continued)

FOREIGN PATENT DOCUMENTS

| | | |
|---|---|---|
| CN | 1367636 A | 9/2002 |
| CN | 202534699 U | 11/2012 |

(Continued)

OTHER PUBLICATIONS

Office Actions of JP Patent Application No. 2020-501149.

(Continued)

*Primary Examiner* — Elizabeth E Mulvaney
(74) *Attorney, Agent, or Firm* — Kilpatrick Townsend & Stockton (57) ABSTRACT

The present application relates to a display panel and a mask plate for fabricating a display panel. The mask plate for fabricating a display panel includes: a first surface; a second surface opposite to the first surface; and a plurality of through holes spaced apart from each other. The through hole has a first opening formed on the first surface, and a second opening formed on the second surface. An area of the second opening is larger than an area of the first opening. The second openings are arranged in parallel in a first predetermined direction. The first predetermined direction has a predetermined angle with respect to a horizontal direction or a vertical direction of the mask plate, and the predetermined angle does not include 90°.

16 Claims, 6 Drawing Sheets

(56) References Cited

U.S. PATENT DOCUMENTS

| | | |
|---|---|---|
| 9,728,588 B2 | 8/2017 | Peng et al. |
| 10,604,833 B2 | 3/2020 | Bai |
| 2003/0199144 A1 | 10/2003 | Atobe et al. |
| 2008/0290794 A1 | 11/2008 | Yuasa |
| 2013/0234917 A1 | 9/2013 | Lee |
| 2016/0145762 A1 | 5/2016 | Im et al. |
| 2016/0253943 A1 | 9/2016 | Wang |
| 2016/0253972 A1 | 9/2016 | Bai et al. |
| 2016/0293899 A1 | 10/2016 | Hong |
| 2016/0329385 A1 | 11/2016 | Qiu et al. |

FOREIGN PATENT DOCUMENTS

| | | | |
|---|---|---|---|
| CN | 202576545 U | | 12/2012 |
| CN | 103123927 A | | 5/2013 |
| CN | 103388121 A | | 11/2013 |
| CN | 103556112 | * | 2/2014 |
| CN | 104752469 A | | 7/2015 |
| CN | 105568217 A | | 5/2016 |
| CN | 106011744 A | | 10/2016 |
| CN | 106033802 | * | 10/2016 |
| CN | 107227438 A | | 10/2017 |
| CN | 107740041 A | | 2/2018 |
| CN | 108300963 A | | 7/2018 |
| JP | 2002305079 A | | 10/2002 |
| JP | 2006152396 A | | 6/2006 |
| JP | 2008277264 A | | 11/2008 |
| JP | 2013187187 A | | 9/2013 |
| JP | 2017533475 A | | 11/2017 |
| JP | 2017534085 A | | 11/2017 |
| TW | 201347267 A | | 11/2013 |
| TW | 201709498 A | | 3/2017 |
| WO | 2013166951 A1 | | 11/2013 |
| WO | 2017118003 A1 | | 7/2017 |
| WO | 2018051443 A1 | | 3/2018 |
| WO | 2018227961 A1 | | 12/2018 |
| WO | 2019184265 A1 | | 10/2019 |

OTHER PUBLICATIONS

International Search Report dated Jan. 3, 2019 in the corresponding International application (application No. PCT/CN2018/105515).

CN First Office Action with Search Report dated Feb. 26, 2019 in the corresponding CN application (application No. 201810276753.3).

TW First Office Action with search report dated Oct. 8, 2019 in the corresponding TW application (application No. 107136809).

CN Second Office Action with Supplementary Search Report dated Apr. 28, 2019 in the corresponding CN application(application No. 201810276753.3).

Supplementary European Search Report of EP 18911883.9.

Office Actions of TW Patent Application No. 107136809.

* cited by examiner

MASK PLATES AND DISPLAY PANELS

CROSS-REFERENCES TO RELATED APPLICATIONS

This application is a continuation application for International Application PCT/CN2018/105515, filed on Sep. 13, 2018, which claims the priority benefit of Chinese Patent Application No. 201810276753.3, titled "MASK PLATE AND DISPLAY PANEL", filed on Mar. 30, 2018. The entireties of both applications are incorporated by reference herein for all purposes.

TECHNOLOGY FIELD

The present application relates to the field of display technologies.

BACKGROUND

With the development of display technology, the resolution of the display panel is becoming higher increasingly, and the analyzing degree of the screen is greatly improved. As a result, the density of the pixel array becomes higher and higher, which presents a great challenge to the manufacturing process of the display panel.

SUMMARY

Based on the above, a mask plate that is able to improve the strength of the mask plate, thereby improving the precision of pixel evaporation and avoiding the problem of uneven color development of the display panel is provided.

A mask plate for fabricating a display panel is provided, including: a first surface; a second surface opposite to the first surface; and a plurality of through holes spaced apart from each other, the through hole having a first opening formed on the first surface, and a second opening formed on the second surface, an area of the second opening being larger than an area of the first opening, the second openings being arranged in parallel in a first predetermined direction; the first predetermined direction having a predetermined angle with respect to a horizontal direction or a vertical direction of the mask plate; and the predetermined angle does not include 90°.

In the mask plate mentioned above, the second opening is arranged in parallel in a first predetermined direction at a predetermined angle θ to the horizontal direction or the vertical direction of the mask plate. In this way, the distance between the second openings may be significantly increased without changing the density of the second openings and the area of the second opening, so that the area between the second openings is significantly increased, and the strength of the mask plate is increased; in addition, the connecting area between the second openings is evenly distributed, thereby making the mask evenly stressed.

In one of the embodiments, the second opening is an axisymmetric polygon, and at least one symmetry axis of the second opening is parallel to the first predetermined direction.

In one of the embodiments, the second opening is rectangular, the second opening has a first symmetry axis and a second symmetry axis perpendicular to the first symmetry axis; the first symmetry axis of the second opening is parallel to the first predetermined direction, or the second symmetry axis of the second opening is parallel to the first predetermined direction.

In one of the embodiments, a geometric centerline of the first opening coincides with a geometric centerline of the second opening.

In one of the embodiments, the first opening is located within a range of a projection of the second opening on a plane of the mask plate.

In one of the embodiments, the first opening is a polygon same to the shape of the second opening and is reduced in proportion to a preset size.

In one of the embodiments, the first opening has a different shape from the second opening.

In one of the embodiments, a range of the predetermined angle is from 45° to 135°.

In one of the embodiments, the mask plate further includes a first connecting bridge provided between the first openings and supporting the first surface; and a second connecting bridge provided between the second openings and supporting the second surface, an area of the second connecting bridge being smaller than an area of the first connecting bridge.

In one of the embodiments, the first openings are arranged in parallel in a second predetermined direction, and the second predetermined direction is different from the first predetermined direction.

In one of the embodiments, at least a portion of the first openings are arranged in parallel in the first predetermined direction.

In one of the embodiments, the first openings are arranged in parallel in the first predetermined direction.

In an embodiment, the first opening on the first surface is prepared by etching the first surface toward the second surface, and the second opening on the second surface is prepared by etching the second surface toward the first surface.

A display panel is further provided, including: a display substrate and pixels arranged in an array on the display substrate; and the pixels are fabricated from the mask plate as described above.

According to the technical solution of the present application, the connecting area of the second surface is able to be increased, thereby increasing the strength of the mask plate; in addition, the connecting area between the adjacent second openings of the second surface is evenly distributed, thereby making the mask evenly stressed. The display panel fabricated from the mask plate may avoid the problem of uneven display of the display panel while ensuring high resolution.

BRIEF DESCRIPTION OF THE DRAWINGS

To illustrate the technical solutions according to the embodiments of the present application or in the prior art more clearly, the accompanying drawings for describing the embodiments or the prior art are introduced briefly in the following. Apparently, the accompanying drawings in the following description are only some embodiments of the present application, and persons of ordinary skill in the art can derive other drawings from the accompanying drawings without creative efforts.

DETAILED DESCRIPTION OF THE INVENTION

The above objects, features and advantages of the present application will become more apparent by describing in detail embodiments thereof with reference to the accompanying drawings. Though the above embodiments have been particularly described in details, they may only represent several modes of implementation, and cannot be construed as limiting the scope of the present application. It should be understood by those skilled in the art that a plurality of modification and improvement may be made therein without departing from the spirit of the present application. Therefore, the scope of protection of the present application shall be subject to the appended claims.

The pixel array is generally prepared by an evaporation process, for example, by accurately depositing a light-emitting layer onto a substrate through a fine metal mask plate to form a high-density pixel array. The number of openings of the mask plate is increasing, and the density of the openings is getting larger and larger, resulting in smaller and smaller distances between the openings and the strength of the mask plate is reduced.

In order to increase the strength of the mask plate, it is a common way to change the shape or arrangement of the pixels in order to achieve the purpose of increasing an area of the connecting bridge, thereby improving the strength of the mask plate. However, by changing arrangement of the pixels to increase the strength of the mask plate, the results obtained are usually limited. Moreover, in many cases, it is difficult to increase the strength of the mask plate simply and effectively for the preparation of display panel of a conventional pixel arrangement type and in the case where the arrangement of the pixels cannot be adjusted.

When fabricating the pixels on the display panel, each layer of the material of the pixels needs to be evaporated onto the array substrate by an evaporation process. In the evaporation process, a corresponding Fine Metal Mask plate is required. Since a high temperature is generated during the evaporation process, the fine metal mask plate may occur a thermally expansion at this point, resulting in the fine metal mask plate being drooped under the effect of gravity. Due to the change of the geometry of the fine metal mask plate, the evaporation material cannot be evaporated to a specified position, which affects the evaporation precision, resulting in display unevenness and color mixing of the fabricated display panel.

Figure 1:
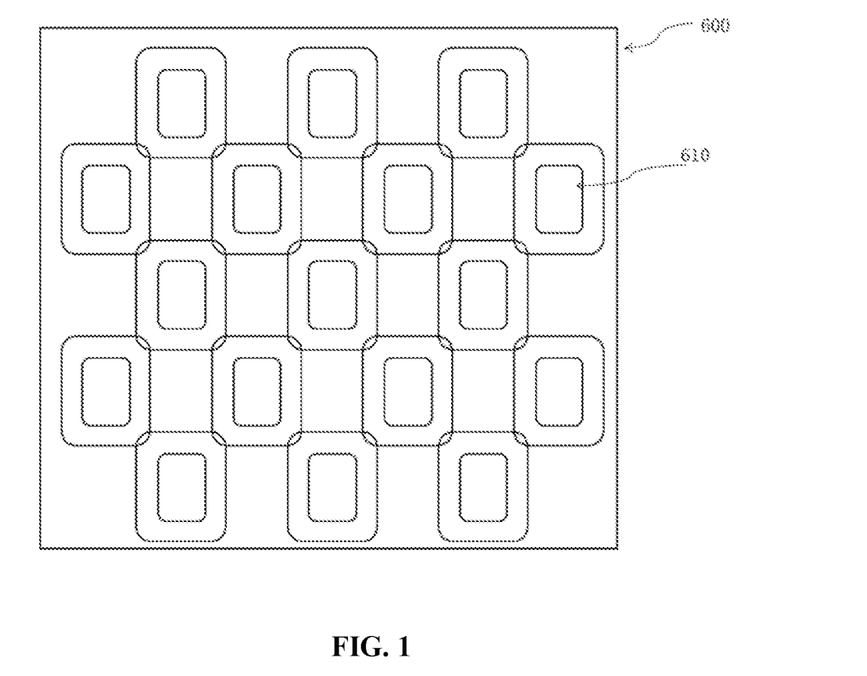
FIG. 1 is a schematic structural view of a fine metal mask plate according to a conventional solution.

FIG. 1 is a schematic structural view of a fine metal mask plate 600 according to a conventional solution. The fine metal mask plate 600 is provided with through holes 610 distributed in an array, and is configured to evaporate the evaporation material onto the array substrate. In order to avoid the problem that the fine metal mask plate 600 is easily deformed in the evaporation process, the fine metal mask plate 600 is usually fixed to a metal frame, and then the fine metal mask plate 600 with the metal frame is fixed on the array substrate to perform evaporation in the conventional solution. Specifically, when fixing the fine metal mask plate 600 in the metal frame, it is necessary to choose an appropriate force firstly to stretch the fine metal mask plate 600, then an appropriate antagonistic force is applied to the metal frame to deform the metal frame, and finally, the stretched fine metal mask plate 600 is fixed on the metal frame that the antagonistic force is applied. In this way, the fine metal mask plate 600 is tensioned by the restoring force due to deformation of the metal frame, so that the fine metal mask plate 600 will not be drooped during the evaporation process. This process of pre-tensioning the fine metal mask plate 600 is generally referred to as a tension process.

Generally, in order to improve the precision of evaporation, it is necessary to perform a PPA (pixel position accuracy) test on the fine metal mask plate, so as to realize positioning of the fine metal mask plate 600 and the array substrate. Therefore, in the tension process, it is necessary to find an appropriate stretching force and an antagonistic force for deforming the metal frame, and to adjust the strength through a test for a real object so as to meet the precision requirement of the evaporation. However, since the through holes 610 of the fine metal mask plate 600 are denser and denser, the distance between the through holes 610, that is, the size of the connecting bridge between the through holes 610, becomes smaller and smaller, the fine metal mask plate is easily damaged in the tension process, the difficulty and cost of the evaporation process are increase, and the preparation efficiency of the evaporation process is affected.

Figure 2:
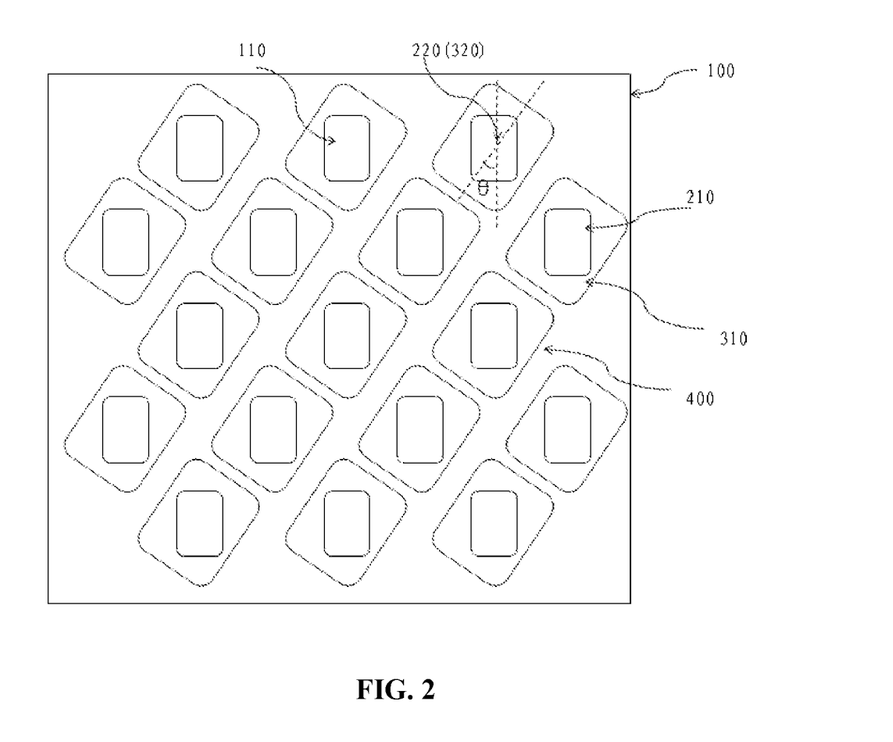
FIG. 2 is a schematic perspective structural view of a mask plate according to an embodiment of the present application.
Figure 3:
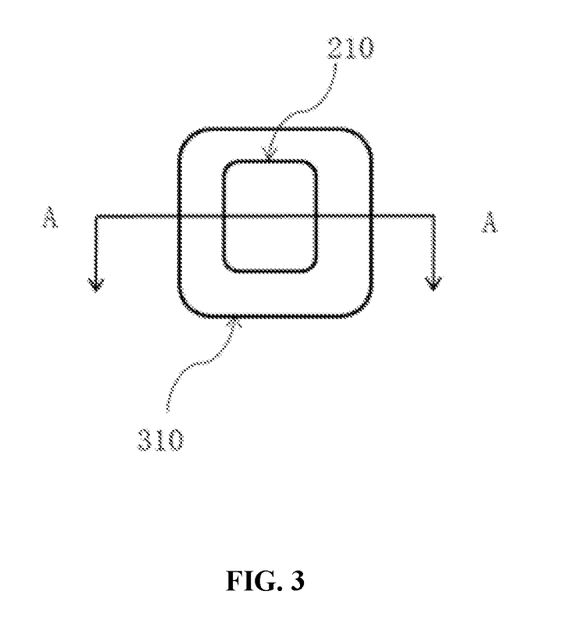
FIG. 3 is a front structural view of the through hole of the mask plate according to an embodiment of the present application.
Figure 4:
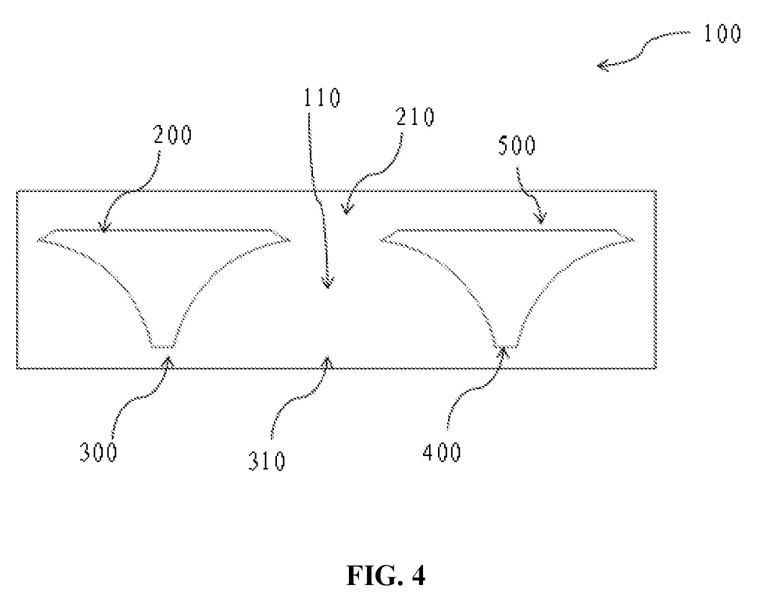
FIG. 4 is a cross-sectional structural view of the through hole of the mask plate of FIG. 3 taken along line AA.

The mask plate according to the present application can improve the strength of the mask plate, thereby improving the precision of pixel evaporation, and avoiding the problem of uneven color development of the display panel. FIG. 2 is a schematic perspective structural view of a mask plate according to an embodiment of the present application. FIG. 3 is a front structural view of the through hole of the mask plate according to an embodiment of the present application. FIG. 4 is a cross-sectional structural view of the through hole of the mask plate of FIG. 3 taken along line A-A. As shown in FIGS. 2 to 4, the mask plate 100 includes a plurality of through holes 110 spaced apart from each other, a first surface 200, and a second surface 300 opposite to the first surface 200. The plurality of through holes 110 form a plurality of first openings 210 on the first surface 200, and the plurality of through holes 110 form a plurality of second openings 310 on the second surface 300. An area of the second opening 310 is larger than an area of the first opening 210. The plurality of second openings are arranged in parallel in the first predetermined direction, and the first predetermined direction is at a predetermined angle θ to a horizontal direction or a vertical direction of the mask plate 100. As shown in FIG. 2, a plurality of rows of second openings 310 may be provided in the first predetermined direction. Since the area of the second opening is larger than the area of the first opening, the connecting area between the second openings determines the strength of the mask plate. In this embodiment, the arrangement of the second opening 310 in the conventional solution is changed. On one hand, the interval between the adjacent second openings 310 is increased, i.e. the connecting area between the adjacent second openings 310 is increased, and thus increasing the strength of the mask plate 100. On the other hand, the connecting area between the adjacent second openings 310 is evenly distributed, which makes the mask plate 100 evenly stressed.

In an embodiment, a first connecting bridge 500 is provided between the first openings 210, configured to connect the first openings 210 and support the first surface 200. A second connecting bridge 400 is provided between the second openings 310, configured to connect the second openings 310 and support the second surface 300. An area of the second connecting bridge 400 is smaller than an area of the first connecting bridge 500.

Since the area of the second opening 310 is larger than the area of the first opening 210, the area of the second connecting bridge 400 is smaller than the area of the first connecting bridge 500, and the area of the second connecting bridge 400 may affect the strength of the mask plate 100 directly. However, due to the increased resolution requirement of the display panel, the density of the openings of the mask plate is becoming larger and larger, and it is very difficult to increase the area of the second bridge 400. As shown in FIG. 1, in the conventional mask plate 600, the first opening and the second opening are generally provided to be arranged in parallel in the horizontal direction or the vertical direction of the mask plate. By using the technical solution of the present application, the second opening 310 is rotated by a predetermined angle θ on the basis of the conventional scheme, such that the second opening 310 is arranged in parallel in a first predetermined direction that is at a predetermined angle θ to the horizontal direction or the vertical direction of the mask plate. Thus, the area of the second connecting bridge 400 can be increased without changing the density of the second openings 310 and the area of the second opening 310, so that the strength of the mask plate 100 is increased. As shown in FIG. 2, according to the mask plate 100 of the present application, after the second opening 310 is rotated by a predetermined angle, the width of the second connecting bridge 400 is significantly increased. Thus, the area of the second connecting bridge is 400 is significantly increased, and the strength of the mask plate 100 of the present application is improved.

In an embodiment, the second opening 310 is an axisymmetric polygon such as an axisymmetric quadrilateral or an axisymmetric hexagon. At least one symmetry axis of the second opening is parallel to the first predetermined direction. It should be noted that if the second opening has a plurality of symmetry axes, the same symmetry axis corresponding to each of the plurality of second openings is parallel to the first predetermined direction.

In an embodiment, the second opening 310 is rectangular. When the second opening is rectangular, the symmetry axes of the second opening may include a first symmetry axis and a second symmetry axis. The first symmetry axis and the second symmetry axis are parallel to the two pairs of sides of the rectangle respectively. The first symmetrical axis of the second opening is parallel to the first predetermined direction, or the second symmetrical axis of the second opening is parallel to the first predetermined direction, that is, the first symmetry axis of the second opening is at a predetermined angle θ to the horizontal direction (the left-right direction in the figure) or the vertical direction (the up-down direction in the figure) of the mask plate, or the second symmetrical axis of the second opening is a predetermined angle θ to the horizontal or vertical direction of the mask plate, so that the second opening is arranged in parallel in the first predetermined direction.

In an embodiment, a geometric centerline of the first opening 210 coincides with a geometric centerline of the second opening 310.

In an embodiment, the first opening 210 is located within a range of a projection of the second opening 310 on a plane of the mask plate.

In an embodiment, a range of the predetermined angle θ is from 45° to 135°, and does not include 90°.

In an embodiment, the first opening 210 is a polygon same to the shape of the second opening 310 and is reduced in proportion to a preset size. It should be noted that the first opening 210 may also have a different shape from the second opening 310.

In an embodiment, the plurality of first openings 210 are arranged in parallel in a second predetermined direction, and the second predetermined direction is different from the first predetermined direction. That is, all the first openings are arranged in a same direction, but the arranging direction of the first openings is different from the arranging direction of the second openings.

Since the first opening 210 on the first surface 200 is etched from top to bottom, and the second opening 310 on the second surface 300 is etched from bottom to top during the fabrication process of the mask plate 100. The two processes are performed simultaneously but independently of each other. Compared to the case in the traditional mask plate 600 where the first and second openings are arranged in parallel arrangement in the horizontal or vertical direction of the mask plate, since only a rotation angle θ is required for etching when etching the second opening 310, there is very little change to the fabrication process of the mask plate.

However, the area of the second connecting bridge 400 of the fabricated mask plate 100 can be increased obviously, thus increasing the strength of the mask plate 100 simply and directly.

Specifically, for example, the second opening is rectangular, and at least one symmetry axis of the second opening is disposed at a predetermined angle θ to the horizontal direction or the vertical direction, thereby increasing the area of the second connecting bridge 400 maximally.

In an embodiment, at least a portion of the first openings 210 are arranged in parallel in the first predetermined direction. That is, there may be a portion of the first openings arranged in the same direction as the second openings.

In an embodiment, the plurality of first openings 210 are arranged in parallel in the first predetermined direction. That is, the arranging direction of the first openings 210 and the arranging direction of the second openings 310 are the same, and both are in the first predetermined direction. Compared to the case in the traditional mask plate 600 where the first and second openings are arranged in parallel arrangement in the horizontal or vertical direction of the mask plate, since the first opening 210 and the second opening 310 are both rotated by an angle θ when etching the first opening 210 and the second opening 310, there is very little change to the fabrication process of the mask plate. However, the area of the second connecting bridge 400 of the fabricated mask plate 100 can be increased obviously, thus increasing the strength of the mask plate 100 simply and directly.

Figure 5:
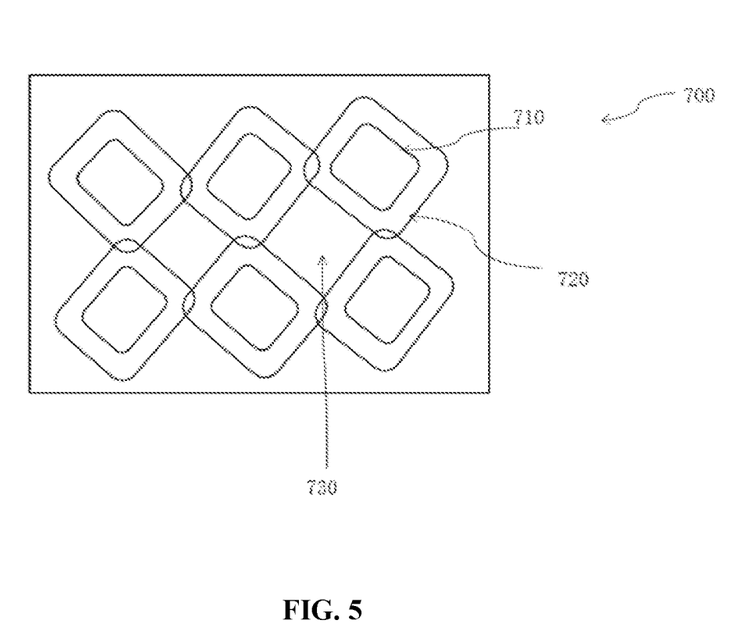
FIG. 5 is a schematic structural view of a mask plate fabricated for an irregularly arranged pixel array according to a conventional solution.

FIG. 5 is a schematic structural view of a mask plate fabricated for an irregularly arranged pixel array according to a conventional solution. As shown in FIG. 5, in the mask plate 700 in which the first openings 710 are irregularly arranged, the arranging direction of the second openings 720 of the mask plate 700 is generally the same as the arranging direction of the corresponding first openings 710 according to the conventional solution. That is, the direction of the corresponding symmetry axes of the second opening 720 and the first opening 710 are the same. Therefore, there will be a problem of irregular and inconsistent shape of the connecting bridge 730, resulting in poor consistency of the mask plate 700, which will easily lead to be uneven stressed and affect the strength of the mask 700.

Figure 6:
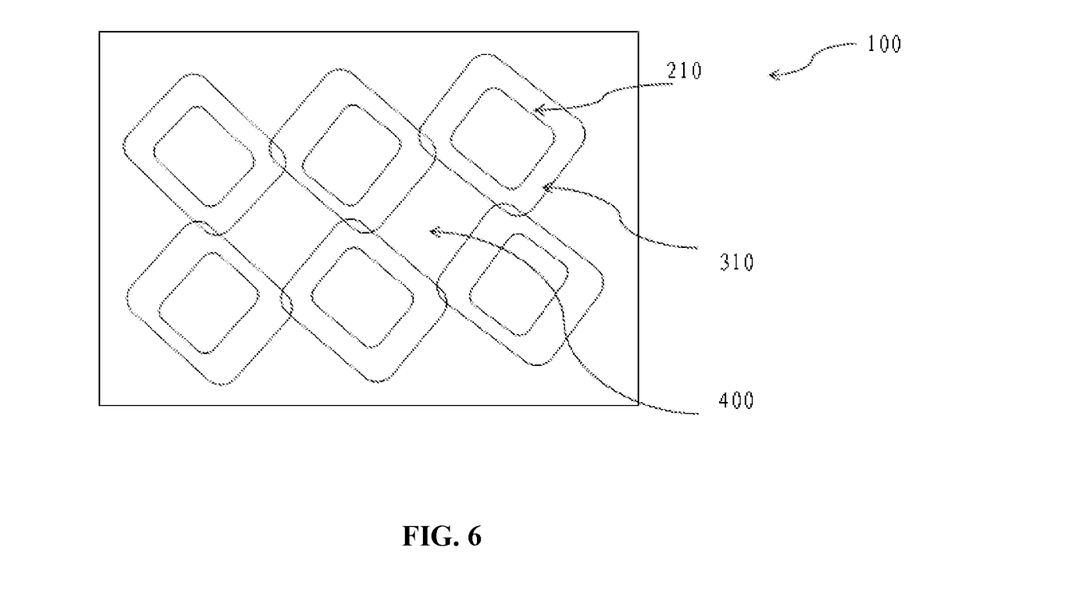
FIG. 6 is a schematic structural view of a mask plate according to another embodiment of the present application.

FIG. 6 is a schematic structural view of a mask plate according to another embodiment of the present application. As shown in FIG. 6, in an embodiment, when the first openings 210 are not arranged in parallel in the same direction, the plurality of second openings 310 are still provided to be arranged in parallel in the first predetermined direction, and the first predetermined direction is at a preset angle to the horizontal direction or the vertical direction of the mask plate, and the preset angle does not include 90°. As mentioned above, in order to solve the problem of inconsistent stress in the mask plate 700 due to the irregular arrangement of the second opening 720 in FIG. 5, the plurality of second openings 310 are provided to be arranged in parallel in the first predetermined direction in the present application, so that the arranging direction of all the second opening 310 is consistent, and the second connecting bridge 400 is arranged in a regular distribution. Therefore, the present application can solve the problem of uneven stress on the mask plate 100 and improve the strength of the mask plate 100. The pixel array irregularly arranged in the display panel may be in a pixel-shared arrangement, may be other non-conventional pixel arrays arranged in RGB, or may be a triangular shape or other polygonal shape.

The present application further relates to a display panel including a display substrate and pixels arranged in an array on the display substrate. The pixels are fabricated from a mask plate as described above. The display panel has high resolution and high pixel evaporation precision, and can solve the problem of uneven display of the display panel.

Comparing FIG. 1 with 2, in the case where the sizes of the first opening 210 and the second opening 310 are unchanged, the area of second connecting bridge 400 between the second openings 310 of the improved mask plate 100 is significantly increased, and the area is increased about at least 1%, thereby increasing the strength of the mask plate 100.

Although the respective embodiments have been described one by one, it shall be appreciated that the respective embodiments will not be isolated. Those skilled in the art can apparently appreciate upon reading the disclosure of this application that the respective technical features involved in the respective embodiments can be combined arbitrarily between the respective embodiments as long as they have no collision with each other. Of course, the respective technical features mentioned in the same embodiment can also be combined arbitrarily as long as they have no collision with each other.

Although the application is illustrated and described herein with reference to specific embodiments, the application is not intended to be limited to the details shown. Rather, various modifications may be made in the details within the scope and range of equivalents of the claims and without departing from the application.

The invention claimed is:

1. A mask plate for fabricating a display panel, comprising:
a first surface;
a second surface opposite to the first surface;
a plurality of through holes being spatially separated, the plurality of through holes including a first through hole having a first opening formed on the first surface and a second opening formed on the second surface, an area of the second opening being larger than an area of the first opening, the second openings being arranged in parallel in a first predetermined direction, the first predetermined direction having a predetermined angle with respect to a horizontal direction or a vertical direction of the mask plate, the horizontal direction being referred to as an x direction, the vertical direction being referred to as a y direction, the predetermined angle excluding 90°;
a first connecting bridge provided between the first openings, and configured to support the first surface;
a second connecting bridge provided between the second openings, and configured to support the second surface;
wherein an area of the second connecting bridge is smaller than an area of the first connecting bridge; and
wherein the predetermined angle is configured to increase the area of the second connecting bridge for strengthening the mask plate.

2. The mask plate of claim 1, wherein the second opening is an axisymmetric polygon, and at least one symmetry axis of the second opening is parallel to the first predetermined direction.

3. The mask plate of claim 2, wherein the second opening is rectangular; the second opening has a first symmetry axis and a second symmetry axis perpendicular to the first symmetry axis; the first symmetry axis of the second opening is parallel to the first predetermined direction, or the second symmetry axis of the second opening is parallel to the first predetermined direction.

4. The mask plate of claim 1, wherein a geometric centerline of the first opening coincides with a geometric centerline of the second opening.

5. The mask plate of claim 4, wherein the first opening is located within a range of a projection of the second opening on a plane of the mask plate.

6. The mask plate of claim 1, wherein the first opening is a polygon same to the shape of the second opening and is reduced in proportion to a preset size.

7. The mask plate of claim 1, wherein the first opening has a different shape from the second opening.

8. The mask plate of claim 1, wherein a range of the predetermined angle is from 45° to 135°.

9. The mask plate of claim 1, further comprising:
a first connecting bridge provided between the first openings and supporting the first surface, and
a second connecting bridge provided between the second openings, and supporting the second surface,
an area of the second connecting bridge being smaller than an area of the first connecting bridge.

10. The mask plate of claim 1, wherein the first openings are arranged in parallel in a second predetermined direction, and the second predetermined direction is different from the first predetermined direction.

11. The mask plate of claim 1, wherein at least a portion of the first openings are arranged in parallel in the first predetermined direction.

12. The mask plate of claim 1, wherein the first openings are arranged in parallel in the first predetermined direction.

13. The mask plate of claim 1, wherein the first opening on the first surface is prepared by etching the first surface toward the second surface, and the second opening on the second surface is prepared by etching the second surface toward the first surface.

14. A display panel, comprising: a display substrate and pixels arranged in an array on the display substrate; and the pixels are fabricated from a mask plate comprising:
a first surface;
a second surface opposite to the first surface; and
a plurality of through holes being spatially separated, the plurality of through holes including a first through holes having a first opening formed on the first surface, and a second opening formed on the second surface, an area of the second opening being larger than an area of the first opening, the second openings being arranged in parallel in a first predetermined direction, the first predetermined direction having a predetermined angle with respect to a horizontal direction or a vertical direction of the mask plate, the horizontal direction being referred to as an x direction, the vertical direction being referred to as a y direction;

a first connecting bridge provided between the first openings, and configured to support the first surface;

a second connecting bridge provided between the second openings, and configured to support the second surface;

wherein an area of the second connecting bridge is smaller than an area of the first connecting bridge;

wherein the predetermined angle is configured to increase the area of the second connecting bridge for strengthening the mask plate; and wherein the predetermined angle does not include 90°.

15. The display panel of claim 14, wherein the pixels are configured in a pixel-shared arrangement.

16. The display panel of claim 14, wherein the second openings are arranged along a substantially diagonal direction, and the second connecting bridge is configured in a regular distribution.

* * * * *